United States Patent
Tsuji

(10) Patent No.: US 6,392,742 B1
(45) Date of Patent: *May 21, 2002

(54) ILLUMINATION SYSTEM AND PROJECTION EXPOSURE APPARATUS

(75) Inventor: Toshihiko Tsuji, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/323,031

(22) Filed: Jun. 1, 1999

(51) Int. Cl.[7] ............... G03B 27/54; G03B 27/52; G03B 27/32; A61N 5/00; G03F 9/00
(52) U.S. Cl. ............... 355/67; 355/55; 355/77; 250/492.2; 250/492.22; 430/5; 430/311; 430/312
(58) Field of Search ............... 355/55, 67, 77; 250/492.2, 492.22; 430/5, 311, 312

(56) References Cited

U.S. PATENT DOCUMENTS

| | | | |
|---|---|---|---|
| 4,918,583 A | 4/1990 | Kudo et al. | 362/268 |
| 5,153,773 A | 10/1992 | Muraki et al. | 359/619 |
| 5,305,054 A | 4/1994 | Suzuki et al. | 355/53 |
| 5,305,059 A | 4/1994 | Kurosawa | 355/208 |
| 5,345,292 A | 9/1994 | Shiozawa et al | 355/67 |
| 5,463,497 A | 10/1995 | Muraki et al. | 359/618 |
| 5,673,102 A | 9/1997 | Suzuki et al. | 355/53 |
| 6,011,612 A * | 1/2000 | Go et al. | 355/53 |
| 6,067,146 A * | 5/2000 | Mulkens et al. | 355/71 |
| 6,100,961 A * | 8/2000 | Shiraishi et al. | 355/67 |
| 6,211,944 B1 * | 4/2001 | Shiraishi | 355/53 |

FOREIGN PATENT DOCUMENTS

| | | |
|---|---|---|
| EP | 0867772 A2 * | 3/1998 |
| JP | 64-913 | 1/1989 |
| JP | 1-271718 | 10/1989 |
| JP | 1-295215 | 11/1989 |
| JP | 2-48627 | 2/1990 |
| JP | 3-215930 | 9/1991 |
| JP | 4-329623 | 11/1992 |
| JP | 5-251308 | 9/1993 |
| JP | 5-283317 | 10/1993 |
| JP | 6-204114 | 7/1994 |
| JP | 10-270312 | 10/1998 |
| JP | 11-54426 | 2/1999 |

* cited by examiner

Primary Examiner—Russell Adams
Assistant Examiner—Khaled Brown
(74) Attorney, Agent, or Firm—Fitzpatrick, Cella, Harper & Scinto

(57) ABSTRACT

An illumination system includes a light source, an emission angle preserving optical element for emitting light from the light source, at a certain emission angle, a collecting optical system for collecting the light from the emission angle preserving optical element, a pattern forming optical system having at least a diffractive optical element, for producing, on a predetermined plane, a light pattern of a desired shape having a uniform light intensity distribution, by use of light from the light collecting optical system, a multiple-beam producing system for producing a plurality of light beams, a zooming optical system for projecting the light intensity distribution on the predetermined plane, onto a light entrance surface of the multiple-beam producing system at a predetermined magnification, and an illuminating device for superposedly projecting lights from a light exit surface of the multiple-beam producing system, upon a surface to be illuminated.

25 Claims, 9 Drawing Sheets

ILLUMINATION SYSTEM AND PROJECTION EXPOSURE APPARATUS

FIELD OF THE INVENTION AND RELATED ART

This invention relates to an illumination system and a projection exposure apparatus. The present invention may be suitably used in an apparatus, called a stepper, for the manufacture of various devices such as IC's, LSI's, CCD's, liquid crystal panels or magnetic heads, for example, wherein a circuit pattern formed on an original such as a photomask or reticle (hereinafter, "reticle") is illuminated uniformly with exposure light of ultraviolet rays or deep ultraviolet rays from an illumination system and the pattern is transferred by projection onto the surface of a wafer, which is coated with a photosensitive material.

In projection exposure apparatuses for the manufacture of semiconductor devices, a reticle having an electronic circuit pattern is illuminated with light from an illumination system, and the circuit pattern is projected and printed by a projection optical system onto the surface of a wafer. In order to attain a high resolving power, the illumination should be made to produce a uniform illuminance distribution within the range of illumination upon the reticle surface or the wafer surface.

For example, projection exposure apparatuses (steppers) may use an illumination system having a combination of a collimator lens and an optical integrator comprising small lenses arrayed at a predetermined pitch, by which exposure light is uniformly projected to the surface that is to be illuminated, such as a reticle surface or a wafer surface.

In an illumination system having such an optical integrator, a plurality of secondary light sources corresponding to the number of the small lenses is produced, and lights from these secondary light sources are superposedly projected, in different directions, to the surface to be illuminated, whereby a uniform illuminance distribution is produced.

Japanese Laid-Open Patent Applications, Laid-Open No. 193/1989, No. 295215/1989, No. 271718/1989, No. 48627/1990 and No. 270312/1998 show an illumination system having an internal reflection type integrator and an amplitude division type integrator (as described above), for enhanced uniformness of the illuminance distribution.

FIG. 9 is a schematic view of a portion of an illumination system having an internal reflection type integrator and an amplitude division type integrator, as disclosed in Japanese Laid-Open Patent Applications, Laid-Open No. 270312/1998.

In the drawing, laser light emitted from a laser light source 101 is once focused just before a light entrance surface of a light pipe 110 (internal reflection type integrator) by means of a lens system 107. After this, the light is diverged and it enters the light pipe 110 while defining a predetermined divergence angle with respect to the inside reflection surface of the light pipe.

The laser light entering the light pipe 110 is propagated while being reflected by the inside surface of the light pipe 110. Thus, the light pipe 110 produces a plurality of virtual images, of the laser light source 101, upon a plane (for example, plane 113) which is perpendicular to the optical axis.

At a light exit surface 110' of the light pipe 110, plural laser beams coming from the virtual images (that is, laser beams which appear as apparently emitted from plural light sources) are superposed one upon another. As a result, a surface light source having uniform intensity distribution is produced at the light exit surface 110' of the light pipe 110.

With an optical system including a condenser lens 105, an aperture stop 111 and a field lens 112, the light exit surface 110' of the optical pipe 110 and a light entrance surface 106 of a fly's eye lens 114 (amplitude division type integrator) are placed in an optically conjugate relation with each other. Thus, the surface light source of uniform intensity distribution produced at the light exit surface 110' is imaged on the light entrance surface 106 of the fly's eye lens 114, whereby light of uniform sectional intensity distribution is incident on the light entrance surface 106 of the fly's eye lens 114. The fly's eye lens 114 produces a plurality of light sources (secondary light sources) at its light exit surface. By means of a condenser lens (not shown) the lights from these light sources are superposed one upon another on a reticle (not shown), by which the pattern of the reticle as a whole is illuminated with uniform light intensity. In FIG. 9, denoted at LF is the imaging light flux of the optical system (105, 111, 112) and denoted at NA is the numerical aperture of the optical system at the light exit side.

The shape of the light pipe 110 is determined by taking into account the divergence angle of the laser light from the lens system 107 as well as the length and width of the light pipe 110, so that the laser beams projected from the light sources to various points on the light entrance surface 106 have optical path differences greater than the coherence length of the laser light. This reduces the coherence with respect to time, thereby suppressing speckle (interference fringe) produced on the light entrance surface 106.

The manufacture of recent large-integration semiconductor devices such as VLSI requires extraordinarily high uniformness of illuminance distribution for the circuit pattern printing. On the other hand, the whole optical system is required to provide an increased transmission factor in order to reduce a loss in the quantity of exposure light. However, in the illumination system shown in FIG. 9, in order to produce a uniform surface light source at the light exit surface of the light pipe, the number of times of inside reflection of the divergent light should be large. To this end, the length of the light pipe should be enlarged while holding the diameter fixed. However, this elongation causes a decrease of the transmission factor due to absorption. Therefore, the length cannot be enlarged, beyond a certain limitation.

This means that improving the uniformness of the illuminance distribution may cause a decrease in the transmission factor, and that retaining a good transmission factor may demand shortening the length of the light pipe, which leads to a failure of the uniform surface light source.

SUMMARY OF THE INVENTION

It is an object of the present invention to provide an illumination system by which a light pattern having a uniform sectional light intensity distribution can be produced without considerably decreasing the transmission factor of an optical system.

It is another object of the present invention to provide a projection exposure apparatus having an illumination system such as described above.

In accordance with an aspect of the present invention, there is provided an illumination system, comprising: a light source; an emission angle preserving optical element for emitting light from said light source, at a certain emission angle; a collecting optical system for collecting the light from said emission angle preserving optical element; a pattern forming optical system having at least one of a relay optical system and a diffractive optical element, for producing, on a predetermined plane, a light pattern of desired shape having a uniform light intensity distribution, by use of light from said light collecting optical system; multiple-beam producing means; a zooming optical system for projecting the light intensity distribution on the predetermined plane, onto a light entrance surface of said multiple-beam producing means at a predetermined magnification; and illuminating means for superposedly projecting lights from a light exit surface of said multiple-beam producing means, upon a surface to be illuminated.

In one preferred form of this aspect of the present invention, another emission angle preserving optical element having a different divergence angle is used interchangeably in response to a change in projection magnification when the light from the predetermined plane is projected by said zooming optical system to the light entrance surface of said multiple-beam producing means, to thereby adjust a numerical aperture of light entering said multiple-beam producing means.

There may be plural diffractive optical elements each being as aforesaid, and one of the diffractive optical elements may be selectively disposed on a light path to change the illuminance distribution on the light entrance surface of said multiple-beam producing means.

The emission angle preserving optical element may include a fly's eye lens having small lenses disposed two-dimensionally.

The diffractive optical element may comprise a computer generated hologram of phase type or amplitude type.

The multiple-beam producing means may include a fly's eye lens having small lenses disposed two-dimensionally, by which light incident thereon is divided into a number of light fluxes when emitted therefrom.

In accordance with another aspect of the present invention, there is provided an illumination system, comprising: a first optical system for forming, with light from a light source, a plurality of secondary light sources; and a second optical system for superposedly projecting lights from said secondary light sources onto a surface to be illuminated; wherein said first optical system includes a diffractive optical element, such as computer generated hologram, for example, for supplying a light pattern having a uniform light intensity distribution and having a shape corresponding to said secondary light sources.

In accordance with a further aspect of the present invention, there is provided a projection exposure apparatus, wherein a reticle having a pattern is illuminated with light from an illumination system as recited above, and wherein the pattern of the reticle as illuminated is projected on a substrate to be exposed.

In accordance with a yet further aspect of the present invention, there is provided a device manufacturing method, comprising the steps of: illuminating a device pattern of a reticle with light from an illumination system as recited above; exposing a wafer with the device pattern as illuminated; and performing a development process to the exposed wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
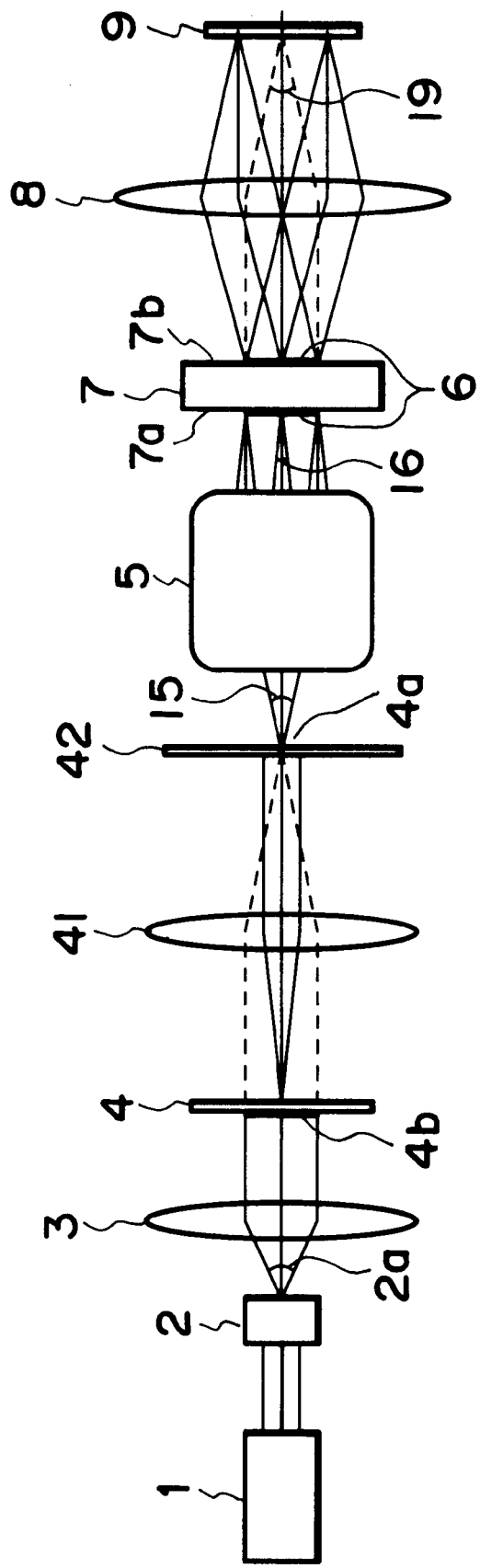
FIG. 1 is a schematic view of a main portion of an illumination system according to a first embodiment of the present invention.

FIG. 1 is a schematic view of a main portion of an illumination system according to a first embodiment of the present invention. In this embodiment, the illumination system is incorporated into a reduction type projection exposure apparatus, called a stepper, for manufacture of semiconductor devices.

Denoted in the drawing at 1 is a light source such as a high-luminance type ultra-high pressure Hg lamp or excimer laser, for example, for emitting ultraviolet rays or deep ultraviolet rays, for example.

Denoted at 2 is an emission angle preserving optical element for emitting light with a constant emission angle. Denoted at 3 is a light collecting optical system for collecting light emitted from the emission angle preserving optical element 2 at a desired emission angle 2a, and for directing the same to a diffractive optical element 4.

Denoted at 41 is a relay optical system for directing light from the diffractive optical element 4 to an aperture 42 (field stop). With this arrangement, a light pattern of desired shape and desired illuminance distribution (to be described later) is produced at the aperture 42. Without use of the relay optical system 41, the light from the diffractive optical element 4 may be directly projected to the aperture 42 to produce a light pattern of desired shape and desired illuminance distribution thereon.

Denoted at 5 is a zooming optical system which serves to receive the light from the aperture 42 and to project and image, at variable magnification, the light pattern at the aperture 42 upon a light entrance surface 7a of multiple-beam producing means 7 such as a fly's eye lens, for example. The multiple-beam producing means 7 produces a light source (image) 6 of uniform illuminance distribution and of a shape corresponding to the image of the light pattern, upon a light exit surface 7b thereof. Denoted at 8 is illuminating means having a condenser lens, for example, for collecting light from the multiple-beam producing means to illuminate a surface 9 to be illuminated, such as the surface of a mask or reticle (hereinafter, "reticle").

The reticle placed at the surface 9 position has a pattern which is projected in a reduced scale by a projection optical system (not shown) onto a wafer which is a photosensitive substrate.

Components shown in FIG. 1 will be described in greater detail.

Figure 2A:
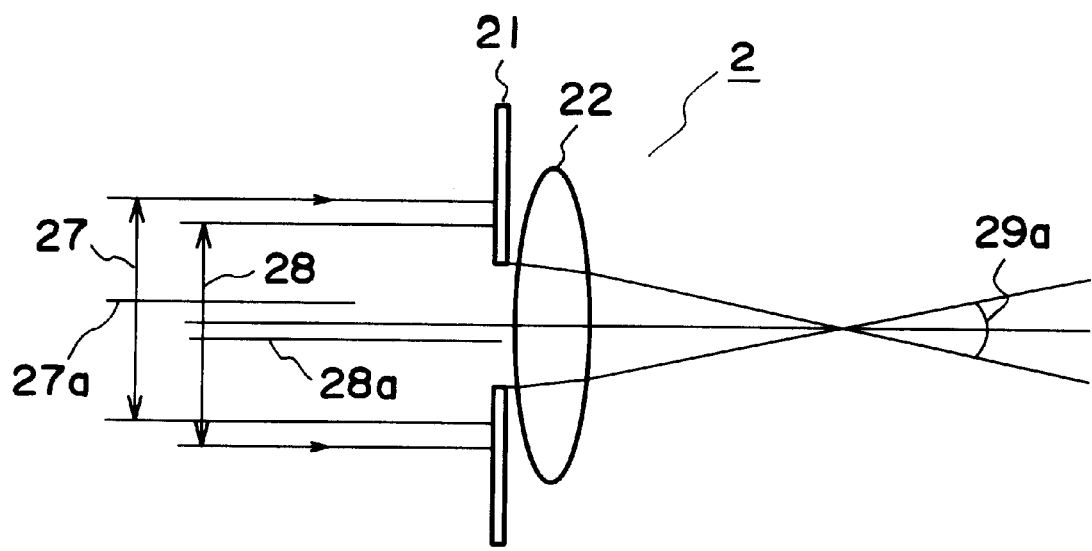
FIGS. 2A and 2B are schematic views, respectively, of a portion of the first embodiment.

As shown in FIG. 2A, the emission angle preserving optical element 2 includes an aperture (stop) 21 and a lens system 22. It has an optical property that, even if the light incident thereon shifts by a small amount in a direction perpendicular to the optical axis, such as from light 27 (optical axis 27a) to light 28 (optical axis 28a), the emission angle 29a of light to be emitted from the element 2 is unchanged and it is held constant.

Figure 2B:
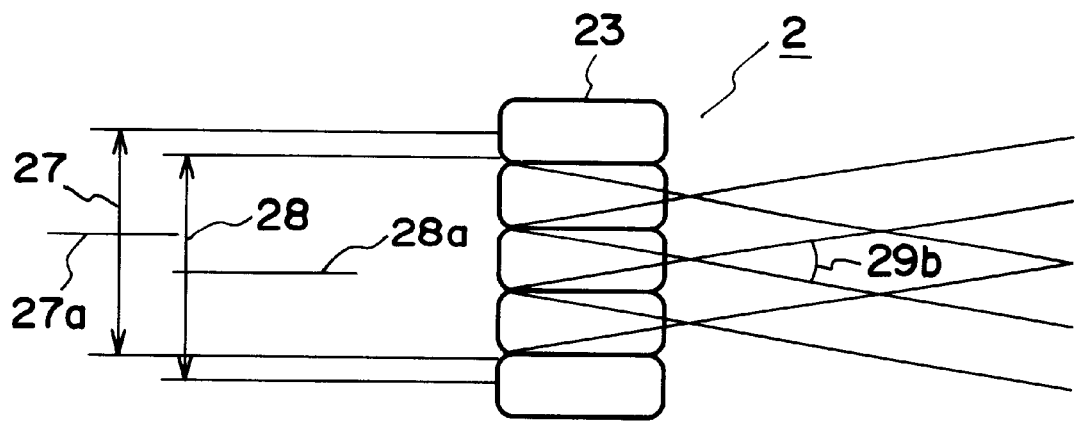

As shown in FIG. 2B, the emission angle preserving optical element 2 may be provided by a fly's eye lens having plural small lenses 23. On that occasion, the emission angle 29b of light is determined in accordance with the shape of the fly's eye lens 23. Also in this case, even if the optical axis of the incident light shifts minutely, such as from light 27 (optical axis 27a) to light 28 (optical axis 28a), the emission angle 29b of the light emitted is unchanged and it is held constant.

The diffractive optical element 4 comprises a computer generated hologram, for example, using an amplitude type or phase distribution type kinoform, for example, having been designed so that it produces a desired illuminance distribution of circular shape or ring-like shape, at the position of the aperture 42, through the relay optical element 41.

Figures 3A, 3B:
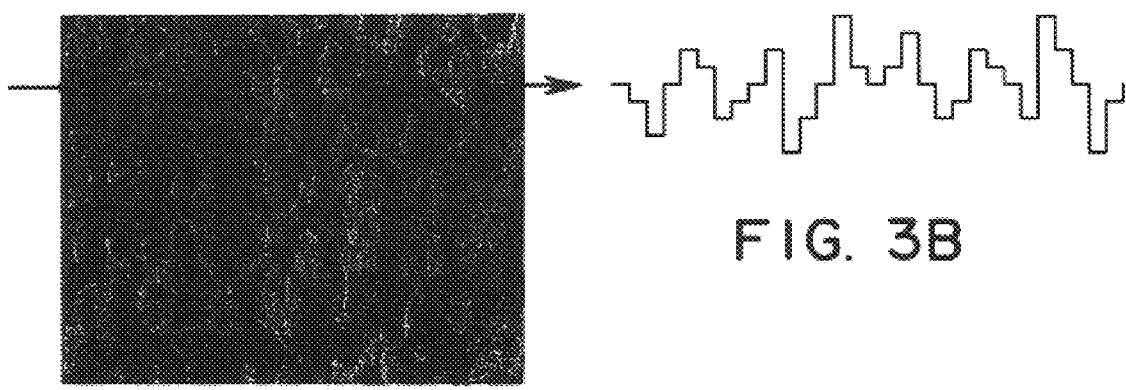
FIGS. 3A and 3B are schematic views, respectively, of a portion of the first embodiment.

FIGS. 3A and 3B are schematic views, respectively, for explaining the diffractive optical element 4. The diffractive optical element shown in FIG. 3A uses a computer generated hologram (CGH) of phase type. The phase distribution is illustrated by contrast distribution. The computer generated hologram is a hologram which can be produced by determining, by calculation, an interference fringe pattern to be produced by interference between object light and reference light and then by directly outputting the result of calculation through a pattern drawing machine. The interference fringe shape for producing a desired illuminance distribution as reproduced light can be determined easily on the basis of optimization through repeated calculations using a computer. Diffractive optical element shown in FIG. 3B uses a phase type CGH, and an example of sectional shape thereof is illustrated. Because of a stepped section as illustrated, the semiconductor device manufacturing technology can be used for the production of the element. Thus, an element having fine steps of small pitch can be produced relatively easily.

A light pattern having desired illuminance distribution to be produced by the diffractive optical element 4 at the aperture 42 position may comprise a circular distribution (FIG. 4A), a ring-like distribution (FIG. 4B) or a quadrupole pattern (FIG. 4C), suitable for various exposure processes using various reticles. The light pattern is projected by a zooming optical system 5 (to be described later) onto a light entrance surface 7a of the multiple-beam producing optical system 7, in a desired size. In the apparatus of FIG. 1, there are plural diffractive optical elements for producing different light patterns, which elements are mounted on a switching device such as a turret (not shown), for example, so that the illumination condition can be changed as desired.

Figure 4A:
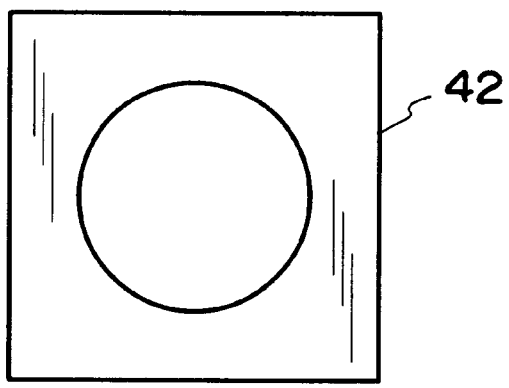
FIGS. 4A, 4B and 4C are schematic views, respectively, for explaining illuminance distribution on an aperture plane shown in FIG. 1.
Figure 4B:
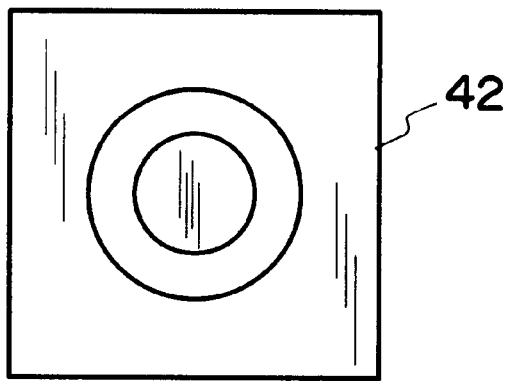
Figure 4C:
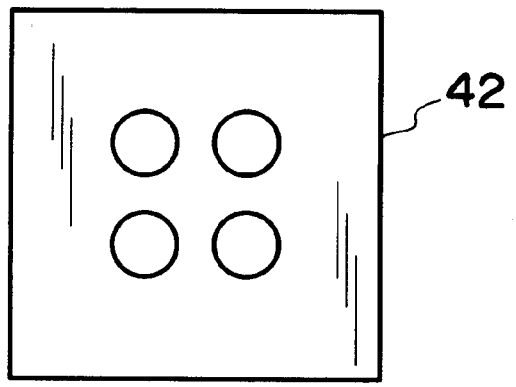

The light incident on the diffractive optical element 4 is diffracted while being amplitude modulated or phase modulated as designed, such that, through the relay optical system 41, a light pattern of desired shape (such as shown in FIG. 4A, 4B or 4C) and uniform intensity within the pattern is produced at the aperture 42 position. Here, the diffractive optical element 4 and the aperture 42 are disposed to satisfy the relation of Fourier transformation plane with each other.

Next, changes of magnification of the zooming optical system 5 will be described. The light pattern 4a produced by the diffractive optical element 4 and having uniform light intensity distribution is projected by the zooming optical system 5 at a desired magnification, onto the light entrance surface 7a of the multiple-beam producing optical system 7 as a light source image 6 of uniform illuminance distribution. Here, the desired magnification refers to a magnification effective to set a uniform light source image 6 of a size providing an optimum incidence angle 19 for the light projected to the surface 9 to be illuminated.

When m is a desired magnification, NA' is the numerical aperture on the light entrance side as determined by the incidence angle 15 to the zooming optical system 5, and NA" is the numerical aperture on the light exit side as determined by the emission angle 16, there is a relation:

$$NA' = m \cdot NA'' \qquad (1)$$

As regards the magnitude of the emission angle 16, from the standpoint of illumination efficiency, it is desirable that the angle does not exceed the entrance side numerical aperture of the multiple-beam producing means 7 but is as close thereto as possible. Therefore, the value of emission angle 16 is set at an optimum angle depending on the multiple-beam producing means 7. Thus, as seen from equation (1), once an optimum magnification for an exposure process with a certain condition is determined, the optimum angle for the emission angle 15 from the aperture 42 is determined.

In this embodiment, the value of incidence angle 15 upon the zooming optical system depends on the size of irradiation region 4b of light impinging on the diffractive optical element 4, and also the size thereof is dependent upon the emission angle 2a of the emission angle preserving optical element 2. Based on the above, in this embodiment, the emission angle preserving optical element 2 is changed to change the illumination condition in various ways, thereby to change the size of the irradiation region 4b. This will be described later with reference to FIG. 5.

The multiple-beam producing means 7 comprises a fly's eye lens having small lenses or a fiber bundle, for example. It produces a surface light source 6 at its light exit surface 7b, comprising a plurality of point light sources (secondary light sources). In this embodiment, the multiple-beam producing means refers to such an optical element as having plural optical axes and finite small regions around these optical axes, wherein one light flux can be specified in each region. An example of such an optical element is a fly's eye lens.

As the light source image 6 having uniform intensity distribution is projected on the light entrance surface 7a of the multiple-beam producing means 7, the illuminance distribution on the light entrance surface is directly transferred to the light exit surface 7b, whereby the same light source (image) 6 is formed there. Lights emitted from small regions (for example, lens elements) at the light exit surface of the multiple-beam producing means 7 are superposed by the irradiating means 8 one upon another on the surface 9, whereby the surface 9 is illuminated so that uniform illuminance distribution is provided as a whole.

The light exit surface 7b of the multiple-beam producing means 7 is placed optically conjugate with the entrance pupil of a projection lens (not shown) for projecting the pattern of the reticle, disposed at the surface 9 position, onto the wafer surface.

Figure 5A:
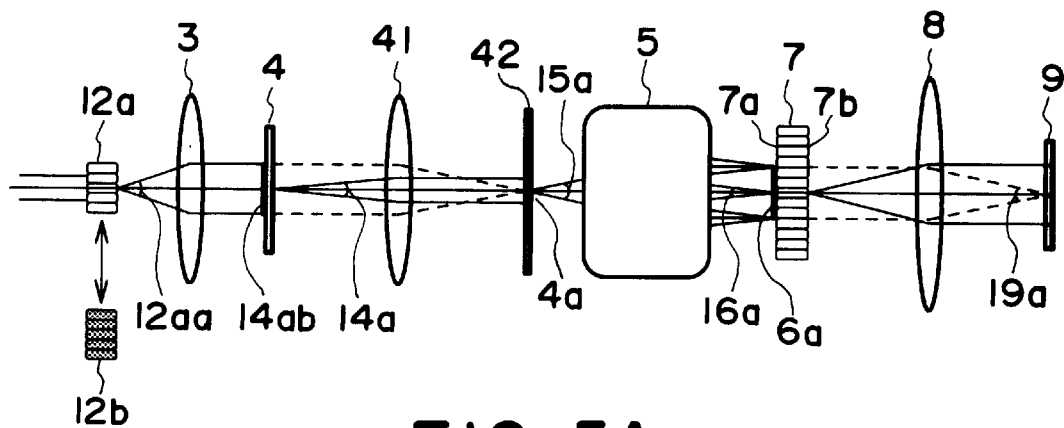
FIGS. 5A and 5B are schematic views, respectively, for explaining exchanging a portion of the first embodiment.
Figure 5B:
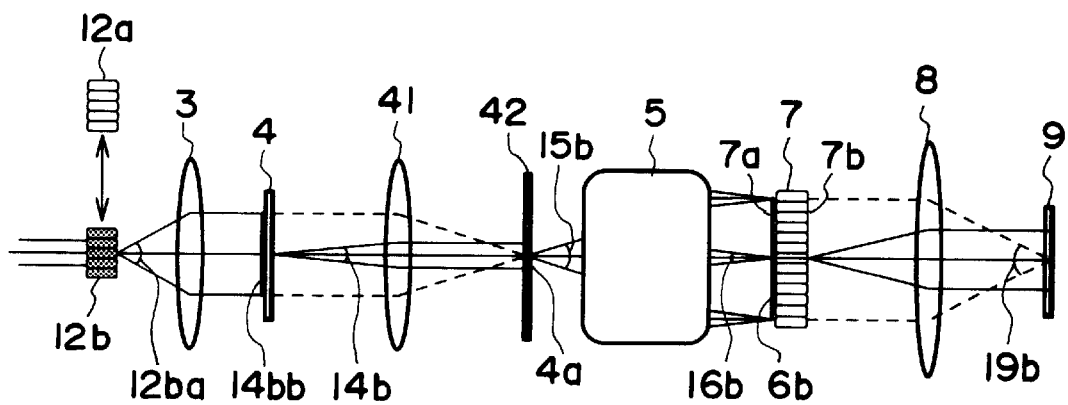

Referring now to FIGS. 5A and 5B, switching control of the emission angle preserving optical element 2 will be described. Denoted in these drawings at 12a is an emission angle preserving optical element having a small emission angle 12*aa*. Denoted at 12*b* is another emission angle preserving optical element having a large emission angle 12*ba*. The remaining portion has essentially the same structure as has been described with reference to FIG. 1.

Generally, in an illumination system used in a semiconductor device manufacturing apparatus, the incidence angle of light impinging on the surface 9 is required to be set to a desired angle. In this embodiment, there are two emission angle preserving optical elements 2 prepared. By interchanging these elements while using a turret, for example, the incidence angle on the surface 9 can be set as desired.

FIG. 5A corresponds to a case where the incidence angle 19*a* of light impinging on the surface 9 is relatively small (this will be referred to a small σ value). In this embodiment, in order to make the σ value small, it is necessary that the image 6*a* of the light pattern 4*a* formed at the aperture 42 is imaged on the light entrance surface 7*a* of the multiple-beam producing means 7, with a small magnification. This can be accomplished by changing the magnification of the zooming optical system 5. As described hereinbefore, the value of emission angle 16*a* is set to an optimum angle in dependence upon the multiple-beam producing means 7.

Thus, from equation (1), once the magnification for obtaining a desired σ value is determined, the divergence angle 15*a* of light from the aperture 42 is determined definitely on the basis of the light pattern 4*a* produced by the diffractive optical element 4. Since the divergence angle 15*a* is determined by the width 14*ab* of light impinging on the diffractive optical element 4, the emission angle preserving optical element is switched to the element 12*a* to provide the small emission angle 12*aa* to narrow the light flux width 14*ab*.

With the above-described procedure, the illumination having high illumination efficiency and with small incidence angle 19*a* (that is, small σ value) is accomplished.

FIG. 5B corresponds to an example of large incidence angle 19*b* (i.e., large σ value). In this case, the emission angle preserving optical element is switched to the element 12*b* having a large emission angle 12*ba*. By this, the emission angle 12*ba* is made large and the width 14*bb* of light impinging on the diffractive optical element 4 is enlarged, such that the angle 15*b* of light diverging from the aperture 42 is enlarged in accordance with the light pattern as produced by the diffractive optical element 4. Even though the image 6*b* of the light pattern 4*a* is projected on the multiple-beam producing means 7 at a large magnification, from the relation set forth in equation (1) the emission angle 16*b* can be made substantially the same as the angle 16*a* described hereinbefore. With the procedure described above, the illumination of high illumination efficiency and with a large emission angle 19*b* (that is, large σ value) can be accomplished.

Here, as regards the divergence angle of light diverging from the diffractive optical element 4, since the angle 14*a* in FIG. 5A is the same as the angle 14*b* in FIG. 5B, the size of the light pattern 4*a* is unchanged even if the emission angle preserving optical element 2 is interchanged. If necessary, the diffractive optical element may be changed by using a turret, for example, in response to the changing of σ value and simultaneously with the switching of the angle preserving optical elements 12*a* and 12*b*.

As described with reference to FIG. 2B, even if the light from the laser light source 1 shifts by a small amount due to external disturbance, the emission angle of light from the emission angle preserving optical element 2 is preserved. Therefore, there is no change in the width 4*b* of light impinging on the diffractive optical element 4 in FIG. 1. Thus, there is substantially no change when the whole light source images in the small lenses 51 of the multiple-beam producing means 7 are observed macroscopically. Therefore, the influence to the illuminance distribution on the surface 9 is very small and can be disregarded.

This means that the illumination system of this embodiment is very stable to a change or shift of light from the laser light source.

Figure 6:
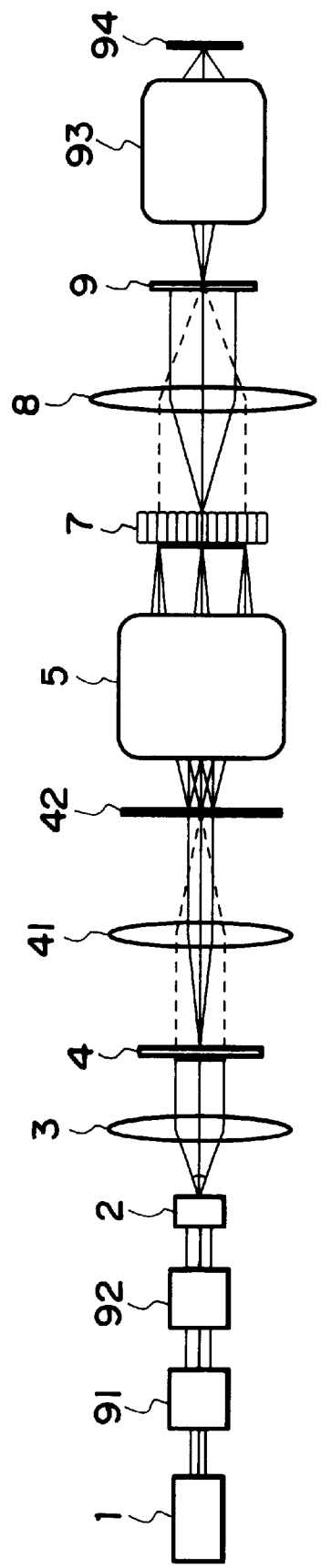
FIG. 6 is a schematic view of a main portion of a projection exposure apparatus, having an illumination system, according to a second embodiment of the present invention.

FIG. 6 is a schematic view of a projection exposure apparatus according to a second embodiment of the present invention, for manufacture of semiconductor devices, using an illumination system of the present invention. In FIG. 6, the elements corresponding to those shown in FIG. 1 are denoted by similar reference numerals.

Denoted in the drawing at 91 is a light shaping optical system for shaping coherent light from a laser light source 1 into a desired beam shape. Denoted at 92 is an incoherent-transformation optical system for transforming coherent laser beam into incoherent light. Denoted at 93 is a projection optical system of the exposure apparatus. Denoted at 94 is a photosensitive substrate such as a wafer, having a photosensitive material applied thereto. Description for those components corresponding to the elements of FIG. 1 will be omitted.

Light emitted from the laser light source 1 goes via a light guiding optical system (not shown) having a mirror and a relay lens, for example, and it enters the light shaping optical system 91. This light shaping optical system 91 comprises plural cylindrical lenses or a beam expander, for example, and it serves to convert the lateral-longitudinal ratio of the sectional shape of the light flux into a The light thus shaped by the beam shaping optical system 91 enters the incoherent-transformation optical system 92 by which it is transformed into incoherent light. This is to prevent interference of light at the wafer surface 94 and the resultant production of speckle.

The incoherent-transformation optical system 92 may comprise an optical system like that disclosed in Japanese Laid-Open Patent Application, Laid-Open No. 215930/1991, wherein incident light is divided at a light dividing plane into at least two light beams (for example, p-polarized light and s-polarized light), wherein one of the light beams passes through an optical member by which an optical path difference greater than the coherency distance of light is applied, wherein the one light beam is directed again to the light dividing plane and is superposed on the other light beam to be emitted together. Thus, by using a deflecting system, plural light beams which are mutually incoherent are produced.

The incoherent-transformed light then enters the emission angle preserving optical element 2.

Then, in accordance with the procedure having been described before, lights are emitted from small regions of the multiple-beam producing means 7 and they are superposed one upon another on the reticle R at the surface 9 position by the irradiating means 8. As a result, the surface 9 is illuminated with uniform illuminance distribution as a whole.

The light now containing information related to the circuit pattern, for example, of the reticle R surface as provided on the surface 9, is projected by the projection optical system 93, whereby the circuit pattern is imaged on the photosensitive substrate 94 at a magnification best suited for the exposure. Exposure of the circuit pattern is thus performed.

The photosensitive substrate is held by a substrate stage (not shown) by vacuum attraction, for example. The substrate stage has a function of translational motion in vertical and horizontal directions, with the movement being controlled by using distance measuring means such as laser interferometers, not shown.

Next, an embodiment of a semiconductor device manufacturing method which uses a projection exposure apparatus such as described above, will be explained.

Figure 7:
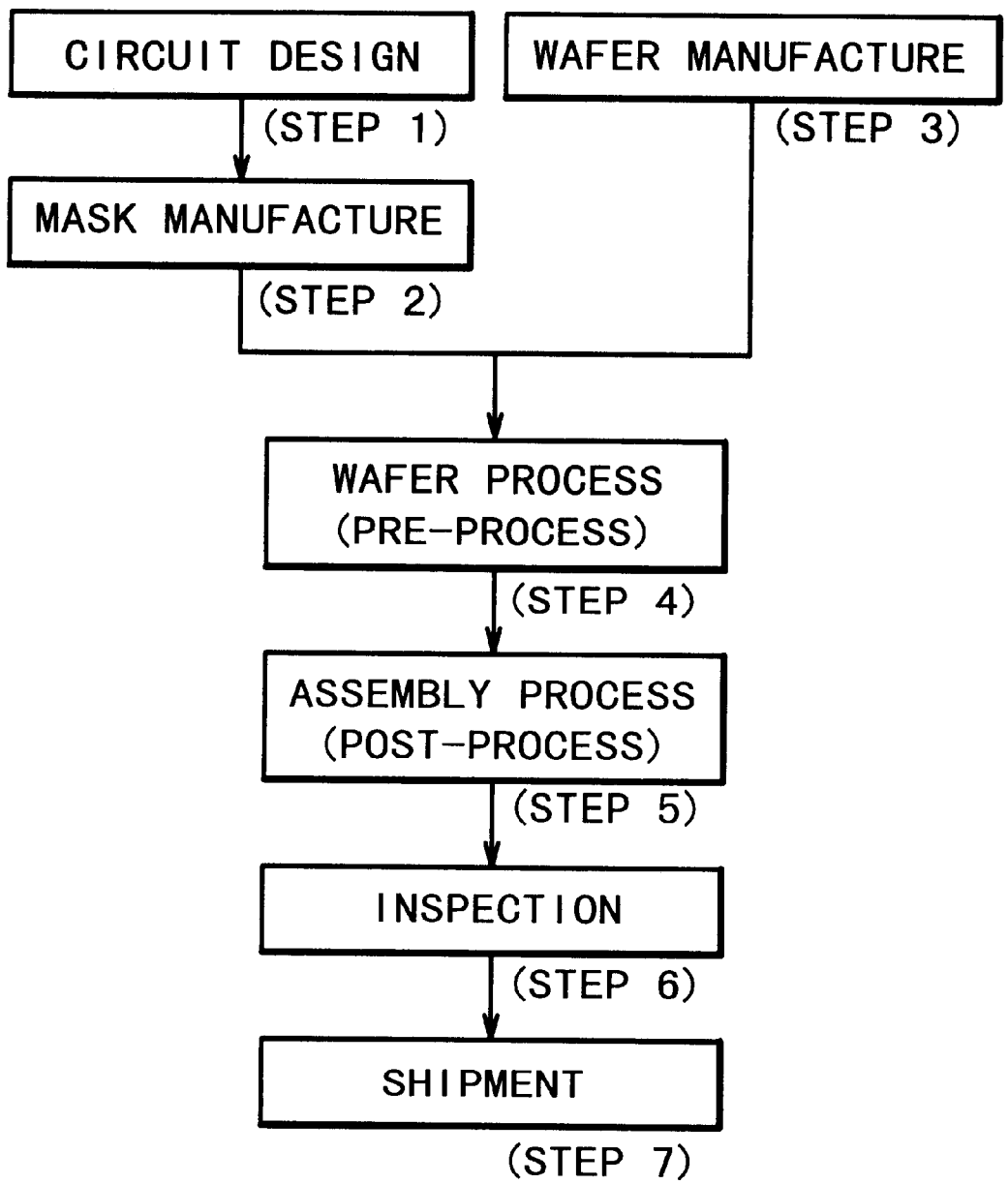
FIG. 7 is a flow chart for explaining a device manufacturing method according to the present invention.
Figure 8:
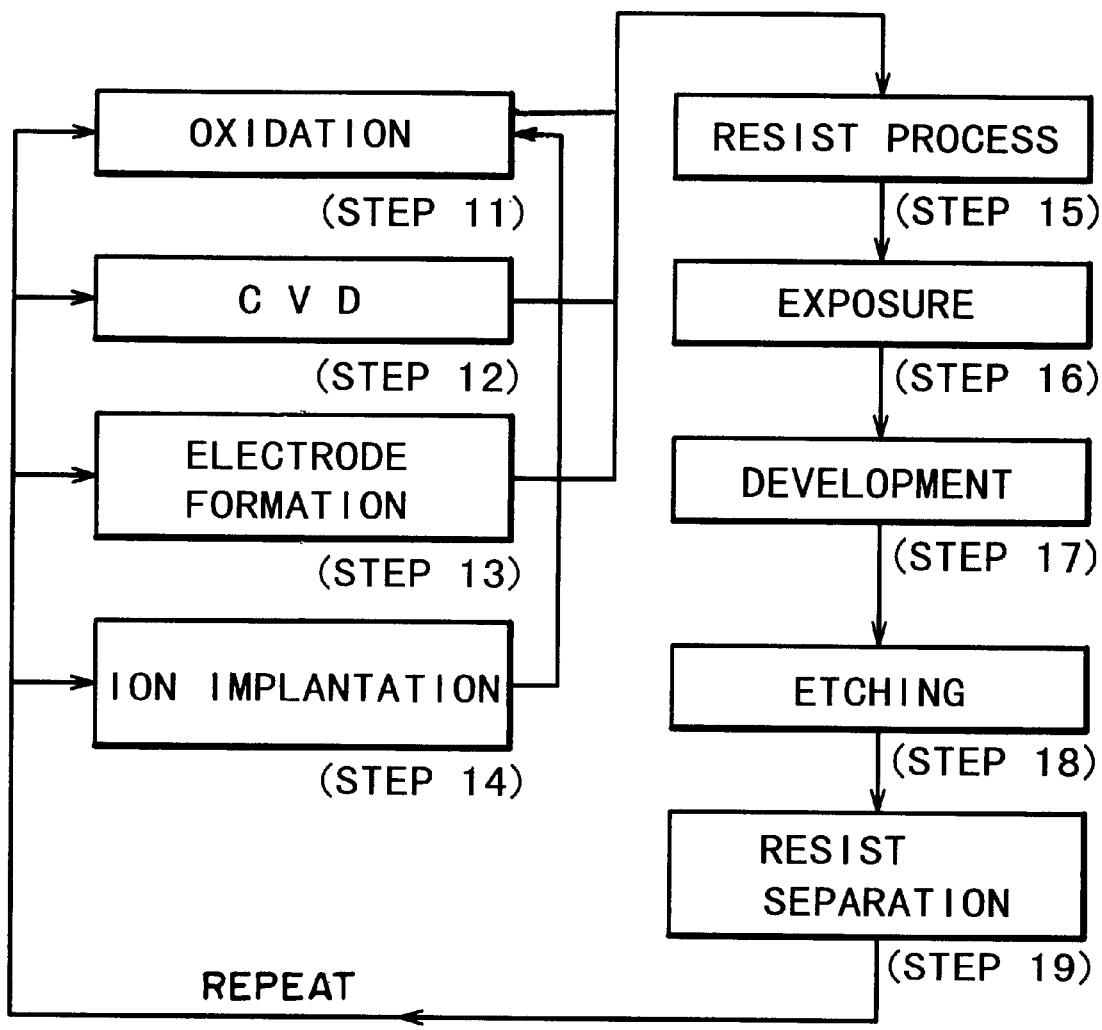
FIG. 8 is a flow chart for explaining a wafer process.
Figure 9:
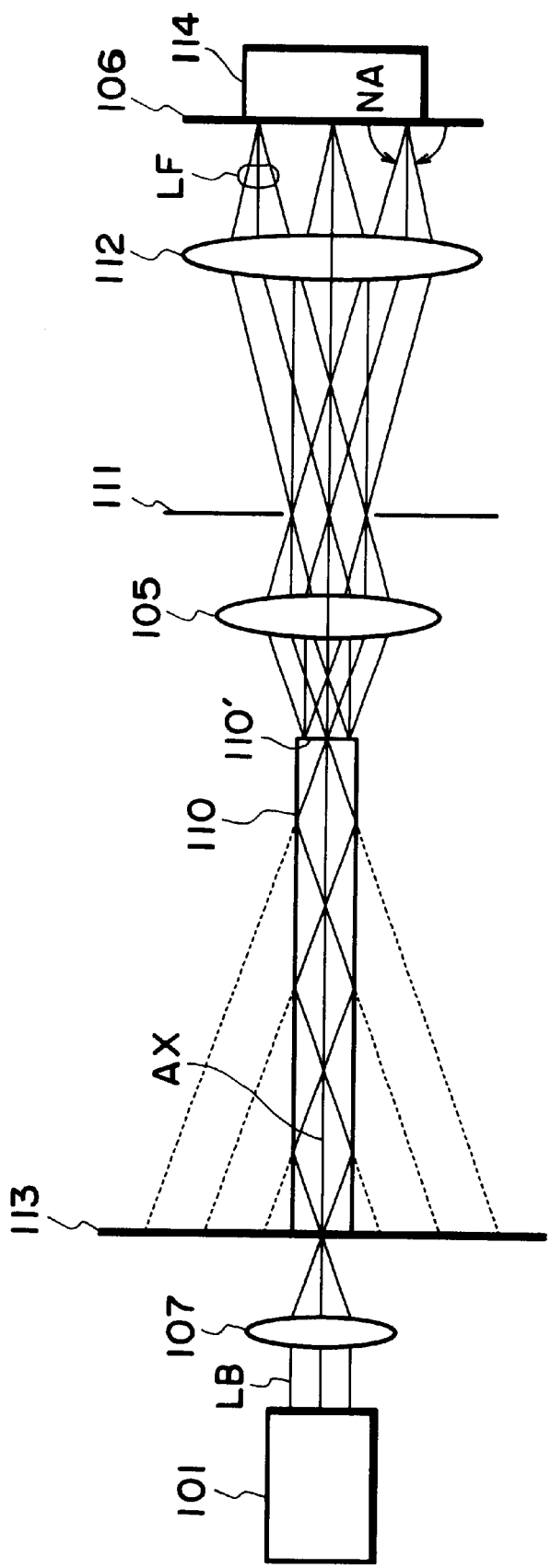
FIG. 9 is a schematic view of an illumination system disclosed in the aforementioned document.

FIG. 7 is a flow chart of procedure for manufacture of microdevices such as semiconductor chips (e.g. ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes assembling (dicing and bonding) process and packaging,(chip sealing) process. Step 6 is an inspection step wherein operation check, durability check and so on for the semiconductor devices provided by step 5, are carried out. With these processes, semiconductor devices are completed and they are shipped (step 7).

FIG. 7 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the present invention, as described hereinbefore, there can be provided an illumination system and a projection exposure apparatus having the same wherein the uniformness of light intensity distribution within the light flux is improved by which the illuminance distribution on the surface being illuminated is uniform and, additionally, the light collecting efficiency is improved. In place of using a long light pipe (internal reflection type integrator), a diffractive optical element of thin glass material is used by which a light pattern having a uniform light intensity distribution and desired shape can be produced. Thus, the present invention can provide an illumination system which assures high efficiency even in the vacuum ultraviolet region.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:
   a light source;
   an emission angle preserving optical element for emitting light from said light source, at a certain emission angle;
   a collecting optical system for collecting the light from said emission angle preserving optical element;
   a pattern forming optical system having at least a computer generated hologram, for producing, on a predetermined plane, a light pattern of a desired shape having a uniform light intensity distribution, by use of light from said collecting optical system;
   multiple-beam producing means for producing a plurality of light beams;
   a zooming optical system for projecting the light intensity distribution on the predetermined plane, onto a light entrance surface of said multiple-beam producing means at a predetermined magnification; and
   illuminating means for superposedly projecting the plurality of light beams from said multiple-beam producing means, upon a surface to be illuminated.

2. An illumination system according to claim 1, wherein another emission angle preserving optical element having a different divergence angle is used interchangeably in response to a change in projection magnification when the light from the predetermined plane is projected by said zooming optical system to the light entrance surface of said multiple-beam producing means, to thereby adjust a numerical aperture of light entering said multiple-beam producing means.

3. An illumination system according to claim 1, further comprising a plurality of computer generated holograms, and wherein one of the computer generated holograms is selectively disposed on a light path to change the illuminance distribution on the light entrance surface of said multiple-beam producing means.

4. An illumination system according to claim 1, wherein said emission angle preserving optical element includes a fly's eye lens having small lenses disposed two-dimensionally.

5. An illumination system according to claim 1, wherein said computer generated hologram is one of a phase type and an amplitude type.

6. An illumination system according to claim 1, wherein said multiple-beam producing means includes a fly's eye lens having small lenses disposed two-dimensionally, by which light incident thereon is divided into a number of light fluxes when emitted therefrom.

7. An illumination system, comprising:
   a first optical system for forming, with light from a light source, a plurality of light beams; and
   a second optical system for superposedly projecting the plurality of light beams from said first optical system onto a surface to be illuminated,
   wherein said first optical system includes a computer generated hologram for supplying a light pattern having a uniform light intensity distribution and having a shape related to an illumination condition.

8. An illumination system, comprising:
   a first optical system for forming, with light from a light source, a plurality of light beams; and
   a second optical system for projecting the plurality of light beams from said first optical system onto a surface to be illuminated,
   wherein said first optical system includes a computer generated hologram for supplying a light pattern having a uniform light intensity distribution and having a shape related to an illumination condition.

9. An illumination system according to claim 7 or 8, wherein said first optical system includes multiple-beam producing means for producing the plurality of light beams at its light exit surface, wherein the light pattern is projected on a light entrance surface of said multiple-beam producing means.

10. An illumination system according to claim 9, wherein the light pattern is formed on a predetermined plane, through a relay optical system.

11. An illumination system according to claim 10, further comprising a third optical system for projecting the light pattern, formed on the predetermined plane, onto the light entrance surface of said multiple-beam producing means.

12. An illumination system according to claim 11, wherein said third optical system includes an imaging optical system having a variable magnification.

13. An illumination system according to claim 7, wherein said first optical system includes a plurality of computer generated holograms for providing light patterns of different shapes, and wherein one of said computer generated holograms is selectively disposed on a path of light from the light source.

14. An illumination system according to claim 8, wherein said first optical system includes a plurality of computer generated holograms for providing light patterns of different shapes, and wherein one of said holograms is selectively disposed on a path of light from the light source.

15. An illumination system according to claim 7, wherein said hologram is one of a phase type and an amplitude type.

16. An illumination system according to claim 8, wherein said hologram is one of a phase type and an amplitude type.

17. An illumination system according to claim 1, wherein said pattern forming optical system includes a relay optical system for projecting diffraction light from said computer generated hologram onto the predetermined plane to form the light pattern of a desired shape on the predetermined plane.

18. An illumination system according to claim 7, wherein said first optical system includes a relay optical system for projecting diffraction light from said computer generated hologram onto a plane to form the light pattern on the plane.

19. An illumination system according to claim 8, wherein said first optical system includes a relay optical system for projecting diffraction light from said hologram onto a plane to form the light pattern on the plane.

20. An illumination system for use in an exposure apparatus, said illumination system comprising:

a computer generated hologram for forming a light pattern having a uniform light intensity distribution and having a shape related to an illumination condition.

21. A projection exposure apparatus, characterized in that a reticle having a pattern is illuminated with light from an illumination system as recited in claim 9, and that the pattern of the reticle as illuminated is projected onto a substrate to be exposed.

22. A device manufacturing method, comprising the steps of:

illuminating a device pattern of a reticle with light from an illumination system as recited in claim 9;

exposing a wafer with the device pattern as illuminated; and performing a development process to the exposed wafer.

23. A projection exposure apparatus, characterized in that a reticle having a pattern is illuminated with light from an illumination system as recited in any one of claims 1–8 and 17–20, and that the pattern of the reticle as illuminated is projected onto a substrate to be exposed.

24. A device manufacturing method, comprising the steps of:

illuminating a device pattern of a reticle with light from an illumination system as recited in any one of claims 1–8 and 17–20;

exposing a wafer with the device pattern as illuminated; and performing a development process to the exposed wafer.

25. An illumination system according to claim 20, wherein said hologram is one of a phase type and an amplitude type.

* * * * *

UNITED STATES PATENT AND TRADEMARK OFFICE
CERTIFICATE OF CORRECTION

PATENT NO. : 6,392,742 B1
DATED : May 21, 2002
INVENTOR(S) : Toshihiko Tsuji

It is certified that error appears in the above-identified patent and that said Letters Patent is hereby corrected as shown below:

Column 7,
Line 10, "prepared." should read -- provided. --.

Column 8,
Line 32, "a" should read -- a desired value --.

Column 9,
Line 16, "so prepared" should read -- so-prepared --.
Line 21, "assembling" should read -- an assembling --.
Line 22, "packaging,(chip" should read -- a packaging, (chip --.
Line 25, "same" should read -- same, --.

Signed and Sealed this

Twenty-ninth Day of October, 2002

Attest:

JAMES E. ROGAN
Attesting Officer     Director of the United States Patent and Trademark Office